(12) United States Patent
Chen et al.

(10) Patent No.: US 11,489,327 B2
(45) Date of Patent: Nov. 1, 2022

(54) CABLE MANAGEMENT DEVICE AND CONNECTION MECHANISM

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 17/511,520

(22) Filed: Oct. 26, 2021

(65) Prior Publication Data

US 2022/0052516 A1    Feb. 17, 2022

Related U.S. Application Data

(63) Continuation of application No. 16/788,321, filed on Feb. 21, 2020, now Pat. No. 11,245,252.

(30) Foreign Application Priority Data

Nov. 5, 2019  (TW) ................... 108140353

(51) Int. Cl.
*H05K 7/18* (2006.01)
*H02G 11/00* (2006.01)
*H05K 7/14* (2006.01)

(52) U.S. Cl.
CPC .......... *H02G 11/00* (2013.01); *H05K 7/1489* (2013.01); *H05K 7/1491* (2013.01); *H05K 7/18* (2013.01); *H05K 7/183* (2013.01)

(58) Field of Classification Search
CPC .... H02G 11/00; H05K 7/1489; H05K 7/1491; H05K 7/18; H05K 7/183
(Continued)

(56) References Cited

U.S. PATENT DOCUMENTS 7,480,154 B2 * 1/2009 Lawrence ............ H05K 7/1491
174/72 A
8,634,198 B2    1/2014 Chen
(Continued)

FOREIGN PATENT DOCUMENTS

CN    109429465 A    3/2019
JP    60-13584 U    1/1985
JP    2019-37115 A    3/2019

*Primary Examiner* — Nkeisha Smith
(74) *Attorney, Agent, or Firm* — Winston Hsu

(57) ABSTRACT

A cable management device includes a first arm and a first connection element. The first arm has a first end portion and a second end portion. The first connection element is pivotally connected to the second end portion of the first arm. One of the first arm and the first connection element is arranged with an engaging feature, and the other one of the first arm and the first connection element is arranged with a corresponding feature. The engaging feature has a connecting portion, a flexible portion, an engaging portion and a contacting portion. When the first arm pivots relative to the first connection element from a first position to a second position by a predetermined angle, the first arm is capable of being kept at the second position relative to the first connection element by cooperation between the engaging feature and the corresponding feature.

20 Claims, 8 Drawing Sheets

(58) Field of Classification Search
USPC .......................................................... 248/70
See application file for complete search history.

(56) References Cited

U.S. PATENT DOCUMENTS

| | | |
|---|---|---|
| 9,072,190 B2 | 6/2015 | Chen |
| 9,144,174 B2 | 9/2015 | Chen |
| 10,292,301 B1 * | 5/2019 | Chen .................... H01R 9/2416 |
| 10,356,932 B2 * | 7/2019 | Chen .................... H05K 7/1491 |
| 2003/0026084 A1 | 2/2003 | Lauchner |
| 2016/0186895 A1 * | 6/2016 | Chen .................... H05K 7/1491 248/68.1 |
| 2017/0250509 A1 * | 8/2017 | Swanson ................ A47B 67/00 |
| 2019/0053396 A1 * | 2/2019 | Chen ...................... H02G 11/00 |
| 2019/0245334 A1 * | 8/2019 | Chen .................... H05K 7/1491 |
| 2020/0060040 A1 * | 2/2020 | Chen .................... H05K 7/1491 |
| 2020/0120829 A1 * | 4/2020 | Chen ...................... F16L 3/015 |
| 2021/0184446 A1 * | 6/2021 | Chen .................... H02G 3/0456 |

* cited by examiner

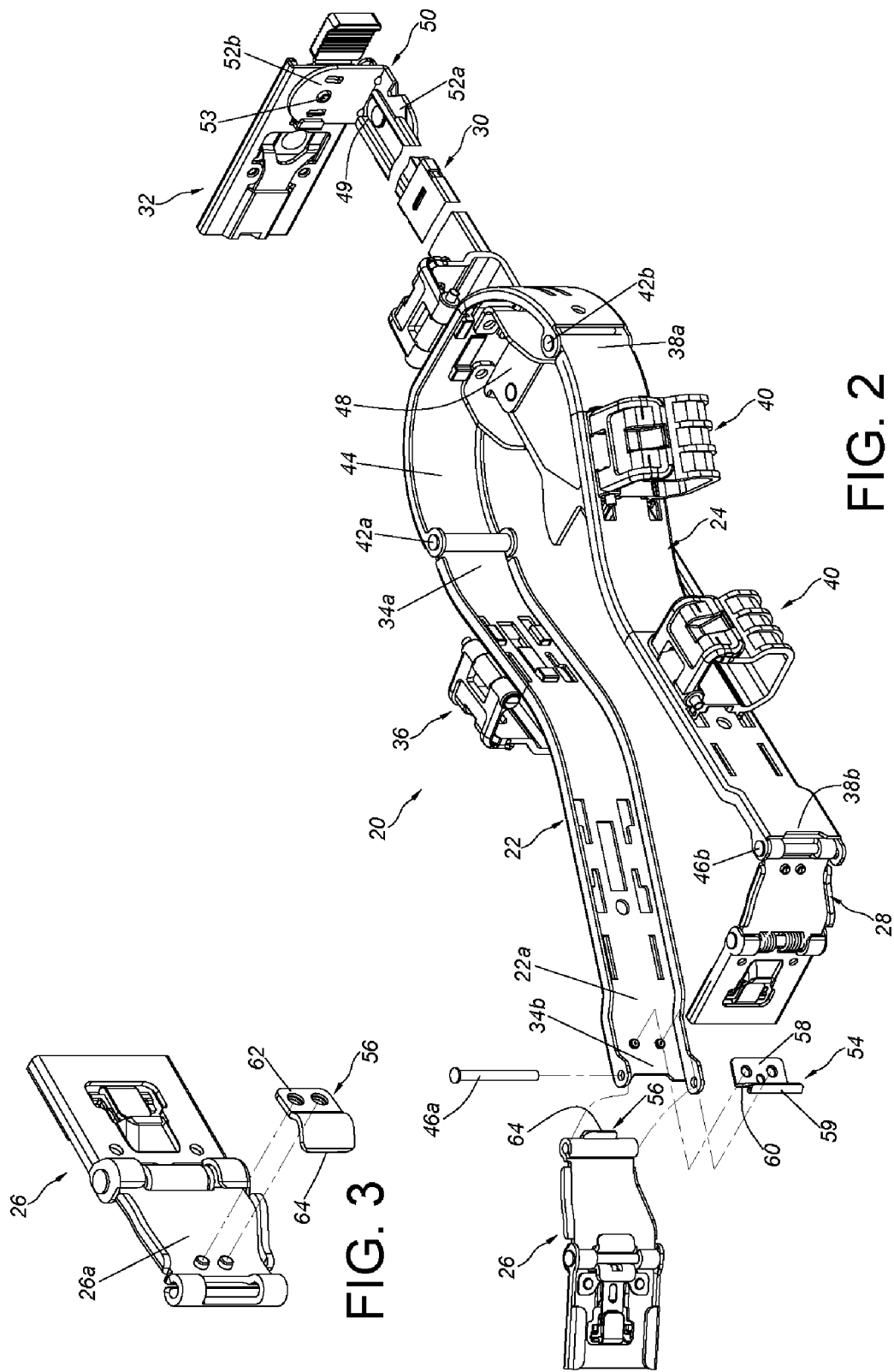

CABLE MANAGEMENT DEVICE AND CONNECTION MECHANISM

CROSS REFERENCE TO RELATED APPLICATIONS

This application is a continuation application of U.S. application Ser. No. 16/788,321, filed on Feb. 12, 2020. This application claims the benefit of U.S. application Ser. No. 16/788,321, which was filed on Feb. 12, 2020, and is incorporated herein by reference.

BACKGROUND OF THE INVENTION

1. Field of the Invention

The present invention relates to a connection mechanism and a cable management device thereof, and more particularly, to a connection mechanism including a cable management device capable of being kept at a predetermined position after being detached therefrom, which is favorable for replacing an electronic module of an apparatus connected to the connection mechanism.

2. Description of the Prior Art

As shown in the US patent with U.S. Pat. No. 9,072,190 B2, a cable management arm is disclosed. The cable management arm includes a first arm, a second arm and at least one support member. The first arm, the second arm and the at least one support member are pivotally connected to a first connection element, a second connection element and a third connection element, respectively. The at least one support member is connected to a bottom of the first arm and a bottom of the second arm through a slide, such that the at least one support member can support the first arm and the second arm.

The first arm is detachably connected to a first fixed rail of a first slide assembly through the first connection element. The second arm is detachably connected to a first movable rail of the first slide assembly through the second connection element. The at least one support member is detachably connected to a second fixed rail of a second slide assembly through the third connection element. The first movable rail of the first slide assembly and a second movable rail of the second slide assembly are configured to carry a carried object (such as a servo equipment).

Because the at least one support member is detachably connected to the second fixed rail of the second slide assembly through the third connection element, when the at least one support member is detached (dismounted) from the second fixed rail of the second slide assembly, only the connection between the first arm and the first fixed rail of the first slide assembly through the first connection element and the connection between the second arm and the first movable rail of the first slide assembly through the second connection element are remained. As a result, the first arm and the second arm tend to swing relative to the first connection element and the second connection element, respectively. Thus, the first arm and the second arm cannot be temporarily kept (or fixed) at a predetermined position. When an electronic module located behind the chassis is desired to be replaced, the unfixed cable management arm may affect the replacement of the electronic module. For example, the cable management arm may move and interfere the replacement path of the electronic module.

Thus, development of a different cable management product becomes an important issue.

SUMMARY OF THE INVENTION

According to one aspect of the present invention, a cable management device includes a first arm and a first connection element. The first arm has a first end portion and a second end portion. The first arm is arranged with at least one first cable management feature located between the first end portion and the second end portion of the first arm. The first connection element is pivotally connected to the second end portion of the first arm. One of the first arm and the first connection element is arranged with an engaging feature, and the other one of the first arm and the first connection element is arranged with a corresponding feature. The engaging feature has a connecting portion, a flexible portion, an engaging portion and a contacting portion. The flexible portion is connected to the connecting portion and bent relative to the connecting portion. The engaging portion is connected to the flexible portion and bent relative to the flexible portion. The contacting portion is connected to the engaging portion and bent relative to the engaging portion. When the first arm pivots relative to the first connection element from a first position to a second position by a predetermined angle, the first arm is capable of being kept at the second position relative to the first connection element by cooperation between the engaging feature and the corresponding feature.

Preferably, when the engaging feature is disengaged from the corresponding feature, the first arm is capable of returning to the first position from the second position relative to the first connection element.

Preferably, the cable management device further includes a second arm and a second connection element. The second arm has a first end portion and a second end portion. The first end portion of the second arm is pivotally connected to the first end portion of the first arm. The second connection element is pivotally connected to the second end portion of the second arm.

Preferably, the second arm is arranged with at least one second cable management feature, and the at least one second cable management feature is located between the first end portion and the second end portion of the second arm.

Preferably, the cable management device further includes at least one support member for supporting the first arm and the second arm.

Preferably, the at least one support member is connected to a bottom of the first arm and a bottom of the second arm through a base.

Preferably, the cable management device further includes a third connection element pivotally connected to the at least one support member. The first connection element, the second connection element and the third connection element are provided to respectively connect the cable management device to a first object, a second object and a third object.

Preferably, the first connection element is pivotally connected to the second end portion of the first arm through a first shaft. The corresponding feature has a mounting portion and a corresponding portion. The corresponding portion is extended from the mounting portion and bent relative to the mounting portion, and the corresponding portion is passed around and protruded from the first shaft.

According to another aspect of the present invention, a cable management device includes a first arm and a first connection element. The first arm is arranged with at least one first cable management feature. The first connection element is pivotally connected to the first arm through a first shaft. One of the first arm and the first connection element is arranged with an engaging feature, and the other one of the first arm and the first connection element is arranged with a corresponding feature. The corresponding feature has a mounting portion and a corresponding portion. The corresponding portion is extended from the mounting portion and bent relative to the mounting portion, and the corresponding portion is passed around and protruded from the first shaft. When the first arm pivots relative to the first connection element to a position, the first arm is capable of being kept at the position relative to the first connection element by cooperation between the engaging feature and the corresponding feature.

Preferably, the engaging feature is an elastic member, and the elastic member has an engaging portion for engaging with the corresponding feature.

According to yet another aspect of the present invention, a cable management device includes a first arm and a first connection element. The first arm is arranged with at least one first cable management feature. The first connection element is pivotally connected to the first arm. One of the first arm and the first connection element is arranged with an engaging feature, and the other one of the first arm and the first connection element is arranged with a corresponding feature. The engaging feature has a connecting portion, a flexible portion, an engaging portion and a contacting portion. The flexible portion is connected to the connecting portion and bent relative to the connecting portion. The engaging portion is connected to the flexible portion and bent relative to the flexible portion. The contacting portion is connected to the engaging portion and bent relative to the engaging portion. When the first arm pivots relative to the first connection element to a position, the first arm is capable of being kept at the position relative to the first connection element by cooperation between the engaging feature and the corresponding feature.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded diagram showing the cable management device according to the embodiment of the present invention.

FIG. 3 is an exploded diagram showing a first connection element and a corresponding feature of the cable management device according to the embodiment of the present invention.

DETAILED DESCRIPTION

Figure 1:
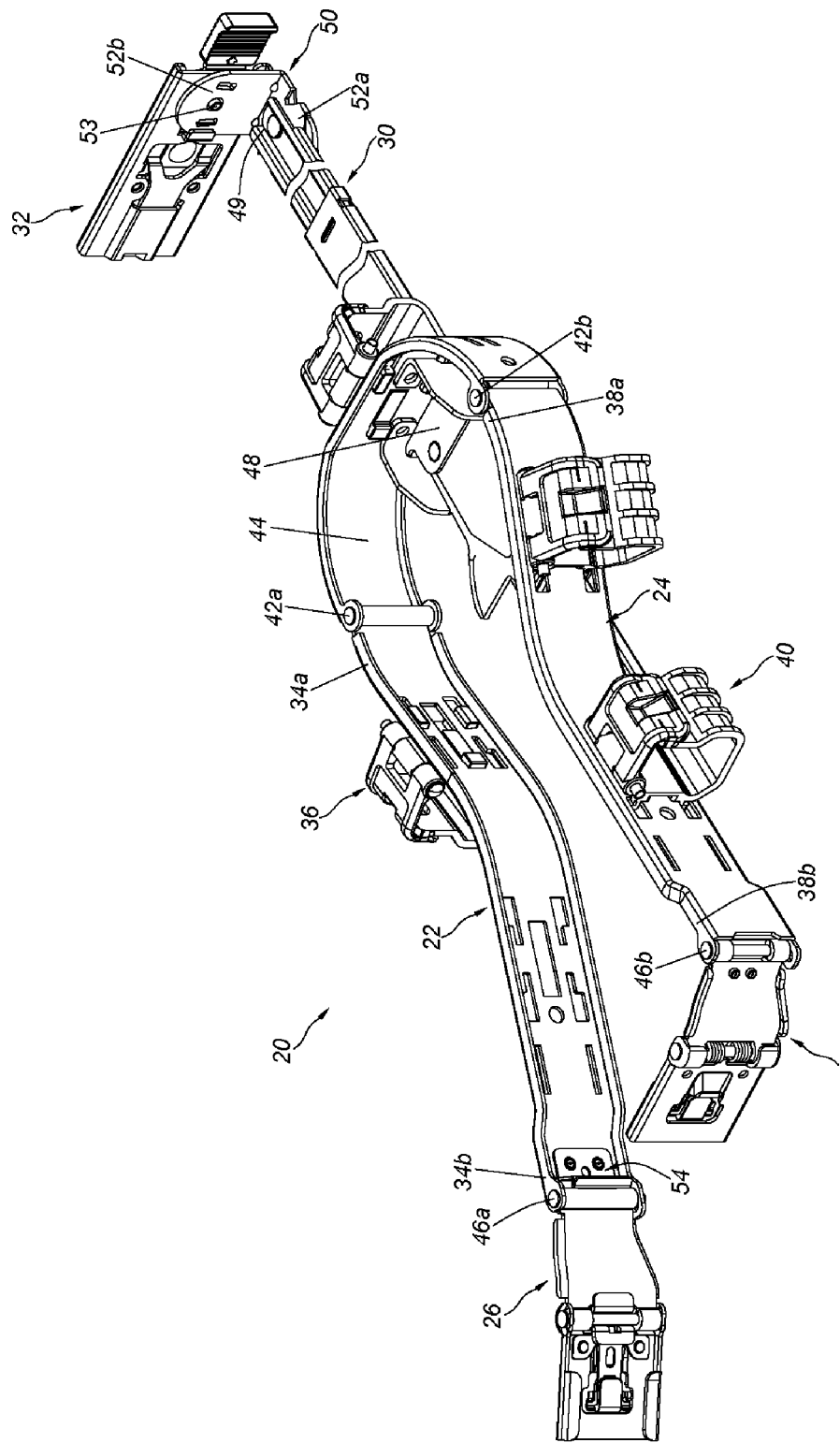
FIG. 1 is a three-dimensional diagram showing a cable management device according to an embodiment of the present invention.

As shown in FIG. 1 and FIG. 2, the cable management device 20 includes a first arm 22, a second arm 24, a first connection element 26, a second connection element 28, at least one support member 30 and a third connection element 32.

The first arm 22 has a first end portion 34a and a second end portion 34b opposite to the first end portion 34a. The first arm 22 is arranged with at least one first cable management feature 36. The at least one first cable management feature 36 is located between the first end portion 34a and the second end portion 34b of the first arm 22. Herein, the at least one first cable management feature 36 is an additional component detachably mounted to the first arm 22, which is exemplary. In other embodiment, the at least one first cable management feature 36 can be a specific structure (such as a groove) directly integrated into the first arm 22. Alternatively, the at least one first cable management feature 36 can be a belt arranged at the first arm 22. The aforementioned examples of the first cable management feature 36 are all for arranging and supporting an electronic cable (not shown), and the present invention is not limited thereto.

The second arm 24 has a first end portion 38a and a second end portion 38b opposite to the first end portion 38a. The second arm 24 is arranged with at least one second cable management feature 40. The at least one second cable management feature 40 is located between the first end portion 38a and the second end portion 38b of the second arm 24. Herein, a structure of the second cable management feature 40 is substantially the same as that of the first cable management feature 36 and is configure to arrange and support the electronic cable. For conciseness, details of the second cable management feature 40 are omitted. The first end portion 38a of the second arm 24 is pivotally connected to the first end portion 34a of the first arm 22. Herein, the first end portion 34a of the first arm 22 and the first end portion 38a of the second arm 24 are pivotally connected to two ends of a mounting element 44 through a first pivot member 42a and a second pivot member 42b, respectively. However, the present invention is not limited thereto. For example, in other embodiment, the first end portion 34a of the first arm 22 could be directly pivotally connected to the first end portion 38a of the second arm 24.

The first connection element 26 is pivotally connected to the first arm 22. Specifically, the first connection element 26 is pivotally connected to the second end portion 34b of the first arm 22. More specifically, the first connection element 26 is pivotally connected to the second end portion 34b of the first arm 22 through a first shaft 46a.

The second connection element 28 is pivotally connected to the second arm 24. Specifically, the second connection element 28 is pivotally connected to the second end portion 38b of the second arm 24. More specifically, the second connection element 28 is pivotally connected to the second end portion 38b of the second arm 24 through a second shaft 46b.

The at least one support member 30 is for supporting at least one of the first arm 22 and the second arm 24. Preferably, the at least one support member 30 is connected to a bottom of the first arm 22 and a bottom of the second arm 24 through a base 48.

The third connection element 32 is pivotally connected to the at least one support member 30. For example, a supporting end 49 of the at least one support member 30 is arranged with a connecting seat 50. The connecting seat 50 has a first connecting section 52a and a second connecting section 52b bent relative to the first connecting section 52a. Herein, the second connecting section 52b is bent substantially perpendicularly relative to the first connecting section 52a, which is only exemplary, and the present invention is not limited thereto. Specifically, the third connection element 32 is pivotally connected to the second connecting section 52b of the connecting seat 50 through an auxiliary shaft 53.

One of the first arm 22 and the first connection element 26 is arranged with an engaging feature 54, and the other one of the first arm 22 and the first connection element 26 is arranged with a corresponding feature 56. Herein, the first arm 22 is arranged with the engaging feature 54, and the first connection element 26 is arranged with the corresponding feature 56, which are exemplary.

The engaging feature 54 is an additional component connected to the first arm 22. Herein, the engaging feature 54 is disposed on a surface 22a of the first arm 22 facing towards the second arm 24, and the engaging feature 54 is an elastic member (such as a leaf spring or a flexible object), which are only exemplary, and the present invention is not limited thereto. The elastic member has an engaging portion 57 (shown in FIG. 4) for engaging with the corresponding feature 56. Specifically, the engaging feature 54 has a connecting portion 58, a contacting portion 59 and a flexible portion 60 located between the connecting portion 58 and the contacting portion 59. The engaging feature 54 is connected to the second end portion 34b of the first arm 22 through the connecting portion 58. The flexible portion 60 is tilted relative to the connecting portion 58. Moreover, the corresponding feature 56 is an additional component connected to the first connection element 26. The corresponding feature 56 has a mounting portion 62 and a corresponding portion 64 (shown in FIG. 3). The mounting portion 62 is connected to the first connection element 26. The corresponding portion 64 is extended from the mounting portion 62. The mounting portion 62 is disposed on a surface 26a of the first connection element 26 away from the second arm 24. The corresponding portion 64 is passed around the first shaft 46a and is extended toward the second arm 24.

Figure 4:
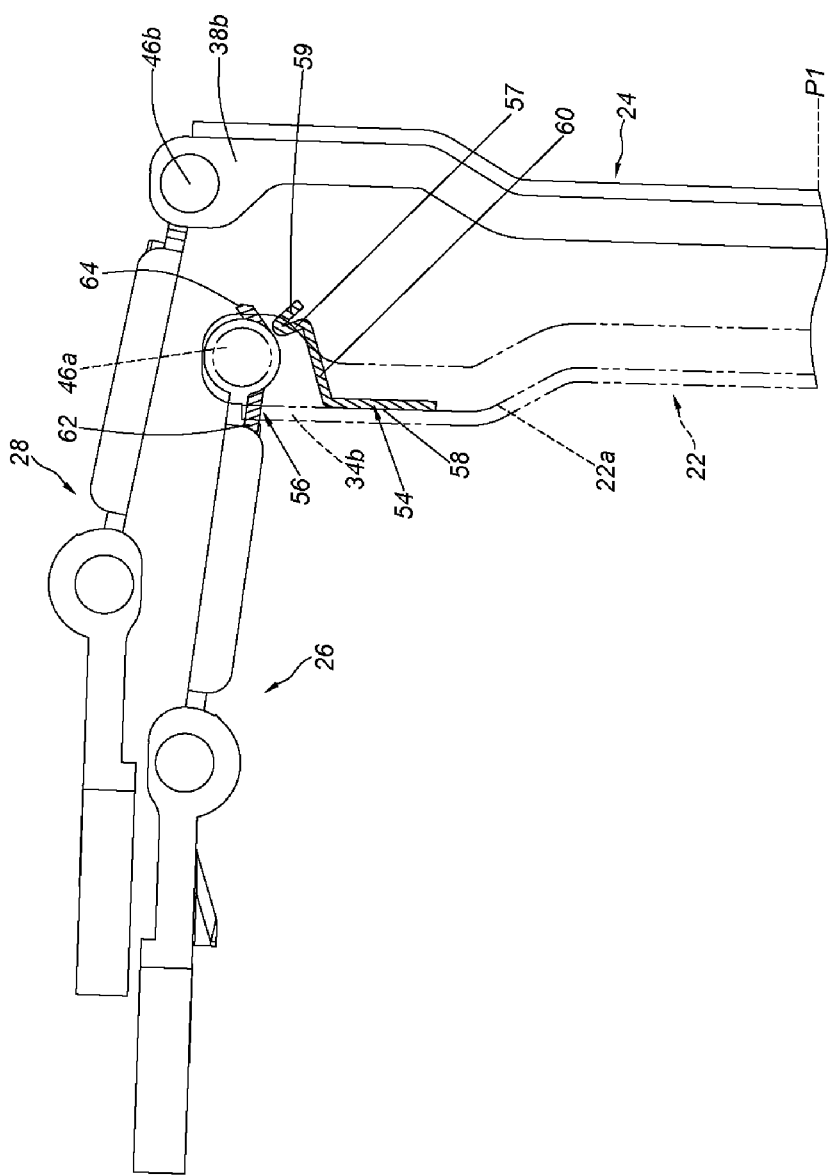
FIG. 4 is a schematic diagram showing the cable management device in which a first arm and a second arm are respectively at a first position relative to a first connection element and a second connection element according to the embodiment of the present invention.

As shown in FIG. 4, the engaging feature 54 has the engaging portion 57 arranged between the flexible portion 60 and the contacting portion 59. Preferably, the engaging portion 57 is a bent portion between the flexible portion 60 and the contacting portion 59. Specifically, the engaging portion 57 is bent relative to the flexible portion 60, and the engaging portion 57 is bent relative to the contacting portion 59. More specifically, the first arm 22 and the second arm 24 can be respectively at a first position P1 relative to the first connection element 26 and the second connection element 28.

Figure 5:
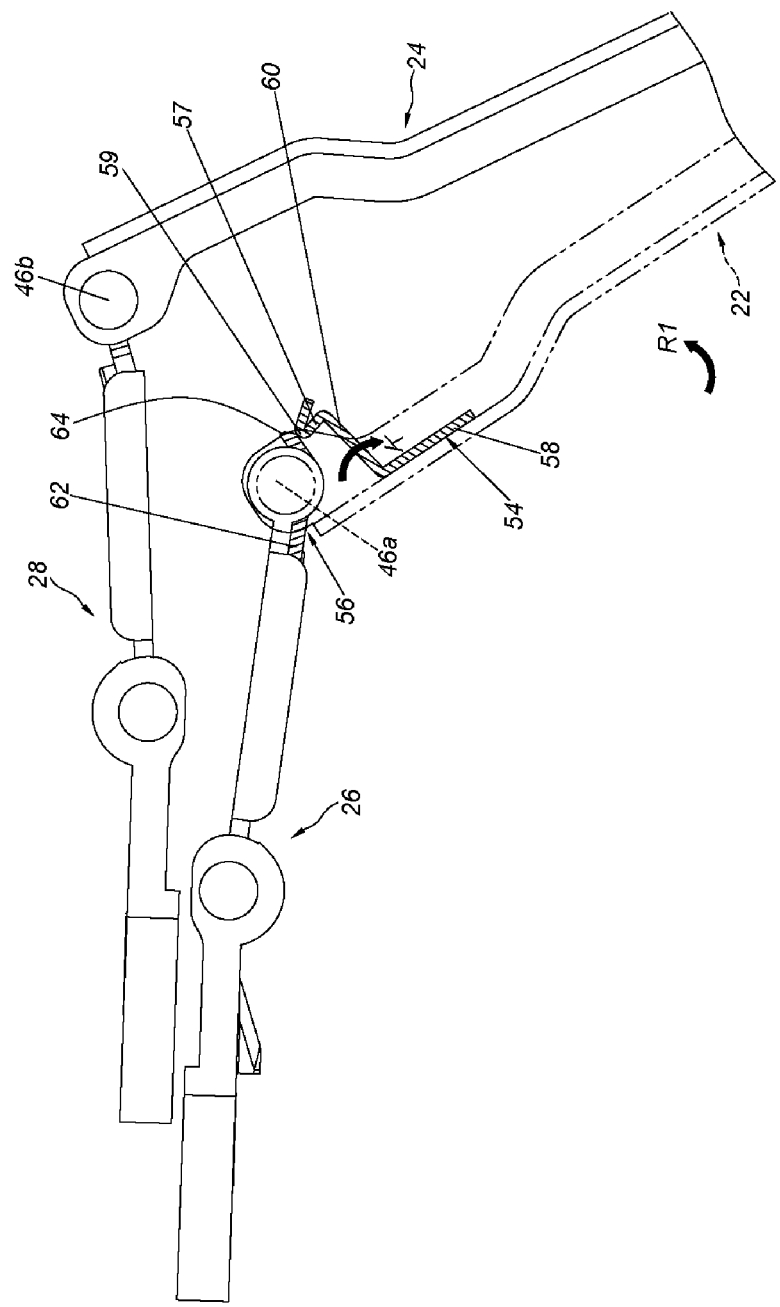
FIG. 5 is a schematic diagram showing the cable management device in which the first arm and the second arm respectively pivot relative to the first connection element and the second connection element along a first rotation direction according to the embodiment of the present invention.
Figure 6:
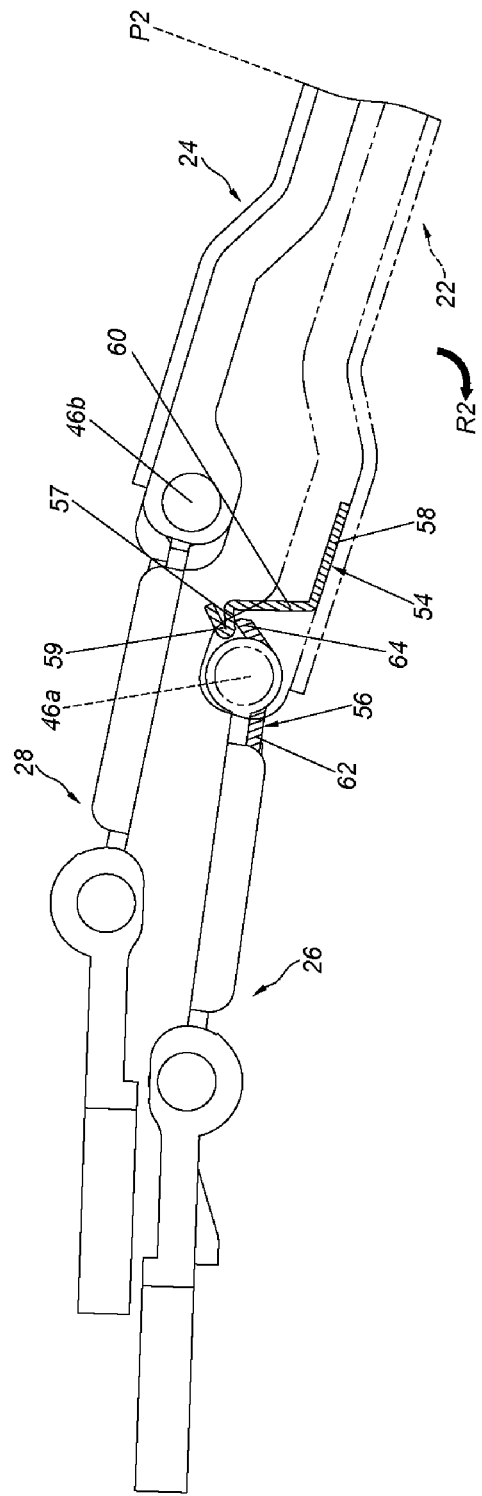
FIG. 6 is a schematic diagram showing the cable management device in which the first arm and the second arm are respectively at a second position relative to the first connection element and the second connection element according to the embodiment of the present invention.

As shown in FIG. 5 and FIG. 6, the first arm 22 and the second arm 24 can respectively pivot relative to the first connection element 26 and the second connection element 28 along a first rotation direction R1 (shown in FIG. 5) from the first position P1 to a second position P2 (shown in FIG. 6) by a predetermined angle.

Specifically, when pivoting towards the second position P2, the contacting portion 59 of the engaging feature 54 of the first arm 22 contacts the corresponding portion 64 of the corresponding feature 56 of the first connection element 26 to generate a force K to the flexible portion 60 of the engaging feature 54, such that the flexible portion 60 of the engaging feature 54 is elastically deformed to accumulate an elastic force till the first arm 22 pivots relative to the first connection element 26 to the second position P2 (shown in FIG. 6) by the predetermined angle. The flexible portion 60 of the engaging feature 54 releases the elastic force, such that the engaging feature 54 can be cooperated with the corresponding feature 56. For example, the first arm 22 is capable of being kept at the second position P2 relative to the first connection element 26 by cooperation between the engaging portion 57 of the engaging feature 54 and the corresponding portion 64 of the corresponding feature 56, such that the first arm 22 pivots from the second position P2 along a second rotation direction R2 opposite to the first rotation direction R1 can be prevented. Moreover, the pivot path that the second arm 24 pivots relative to the second connection element 28 along the second rotation direction R2 is blocked by the first arm 22, the second arm 24 can be kept at the second position P2 relative to the second connection element 28.

As shown in FIG. 6, when a user applies a force to the first arm 22 or the second arm 24 along the second rotation direction R2, and when the force is greater than the elastic force of the flexible portion 60 of the engaging feature 54, the engaging portion 57 of the engaging feature 54 can be disengaged from the corresponding portion 64 of the corresponding feature 56. Alternatively, the user can directly apply a force to the flexible portion 60 of the engaging feature 54 to disengage the engaging portion 57 of the engaging feature 54 from the corresponding portion 64 of the corresponding feature 56. By aforementioned methods, the first arm 22 and the second arm 24 are capable of returning to the first position P1 from the second position P2 relative to the first connection element 26 and the second connection element 28 by pivoting along the second rotation direction R2.

Figure 7:
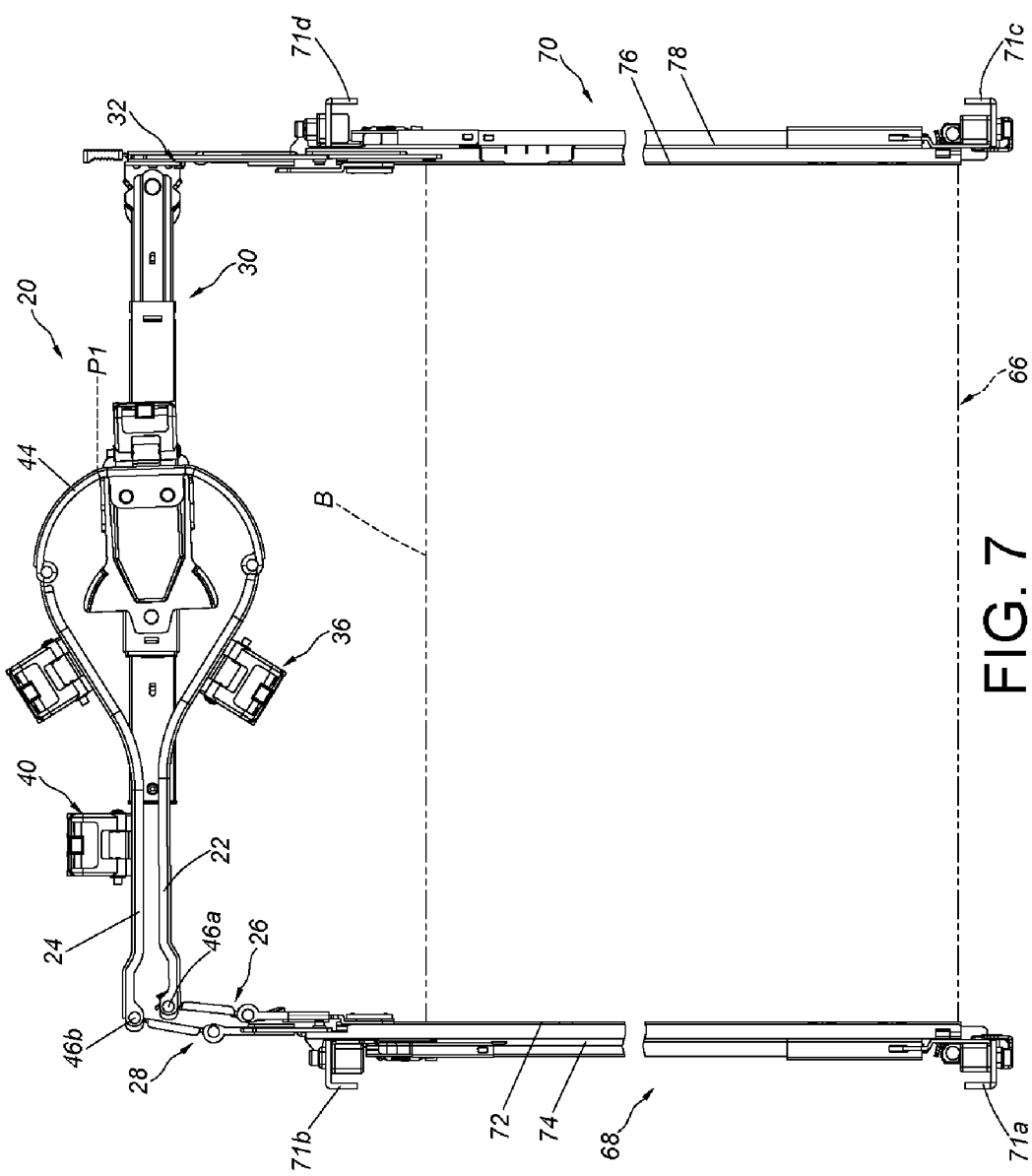
FIG. 7 is a schematic diagram showing the cable management device of the connection mechanism according to the embodiment of the present invention applied to a rack, in which the first arm and the second arm are respectively at the first position relative to the first connection element and the second connection element.
Figure 8:
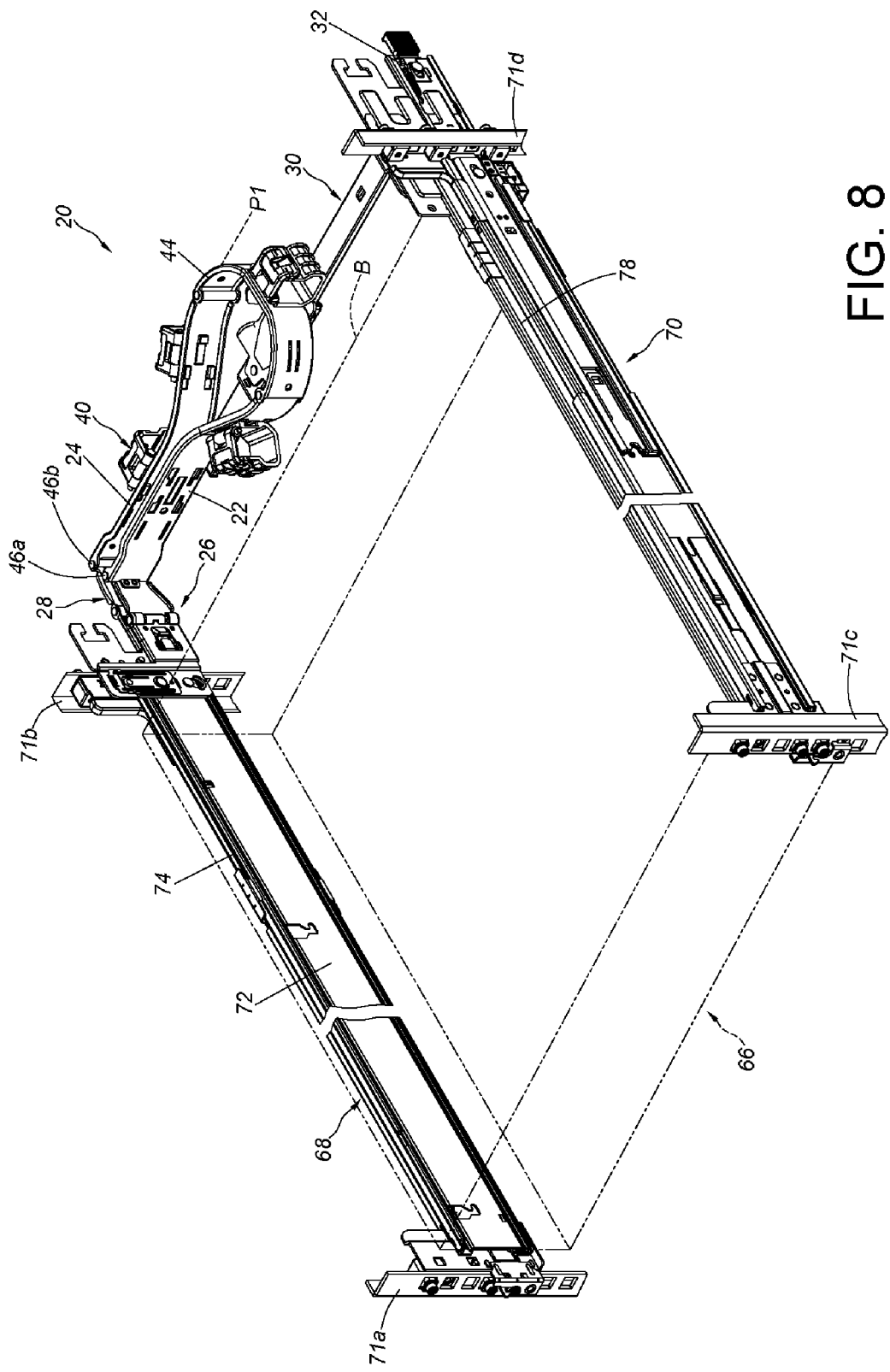
FIG. 8 is a three-dimensional diagram showing the cable management device of the connection mechanism according to the embodiment of the present invention applied to the rack, in which the first arm and the second arm are respectively at the first position relative to the first connection element and the second connection element.

As shown in FIG. 7 and FIG. 8, a carried object 66 is mounted to a rack through a first slide assembly 68 and a second slide assembly 70. Specifically, the first slide assembly 68 includes a first rail (such as an inner rail) and a second rail 74 (such as an outer rail) longitudinally movable relative to the first rail 72. Herein, a front end and a rear end of the second rail 74 are mounted to a first post 71a and a second post 71b of the rack, which is exemplary. Similarly, the second slide assembly 70 includes a third rail 76 (such as an inner rail) and a fourth rail 78 (such as an outer rail) longitudinally movable relative to the third rail 76. Herein, a front end and a rear end of the fourth rail 78 are mounted to a third post 71c and a fourth post 71d of the rack, which is exemplary. The carried object 66 is mounted between the first rail 72 and the third rail 76. The carried object 66 can be moved through the first rail 72 and the third rail 76. The cable management device 20 is arranged behind the carried object 66 and is adjacent to a rear portion B of the carried object 66. The first cable management feature 36 and the second cable management feature 40 of the cable management device 20 are configured to carry an electronic cable of the carried object 66 (such as an electronic apparatus).

The first connection element 26, the second connection element 28 and the third connection element 32 are provided to connect the cable management device 20 to a first object, a second object and a third object, respectively. Specifically, the first connection element 26 is detachably connected to the first rail 72 of the first slide assembly 68, the second connection element 28 is detachably connected to the second rail 74 of the first slide assembly 68, and the third connection element 32 is detachably connected to the second slide assembly 70. Specifically, the first connection element 26 is detachably connected to a rear end of the first rail 72 of the first slide assembly 68, the second connection element 28 is detachably connected to a rear end of the second rail 74 of the first slide assembly 68, and the third connection element 32 is detachably connected to a rear end of the fourth rail 78 of the second slide assembly 70. Furthermore, the first slide assembly 68, the second slide assembly 70 and the cable management device 20 can forma connection mechanism.

Figure 9:
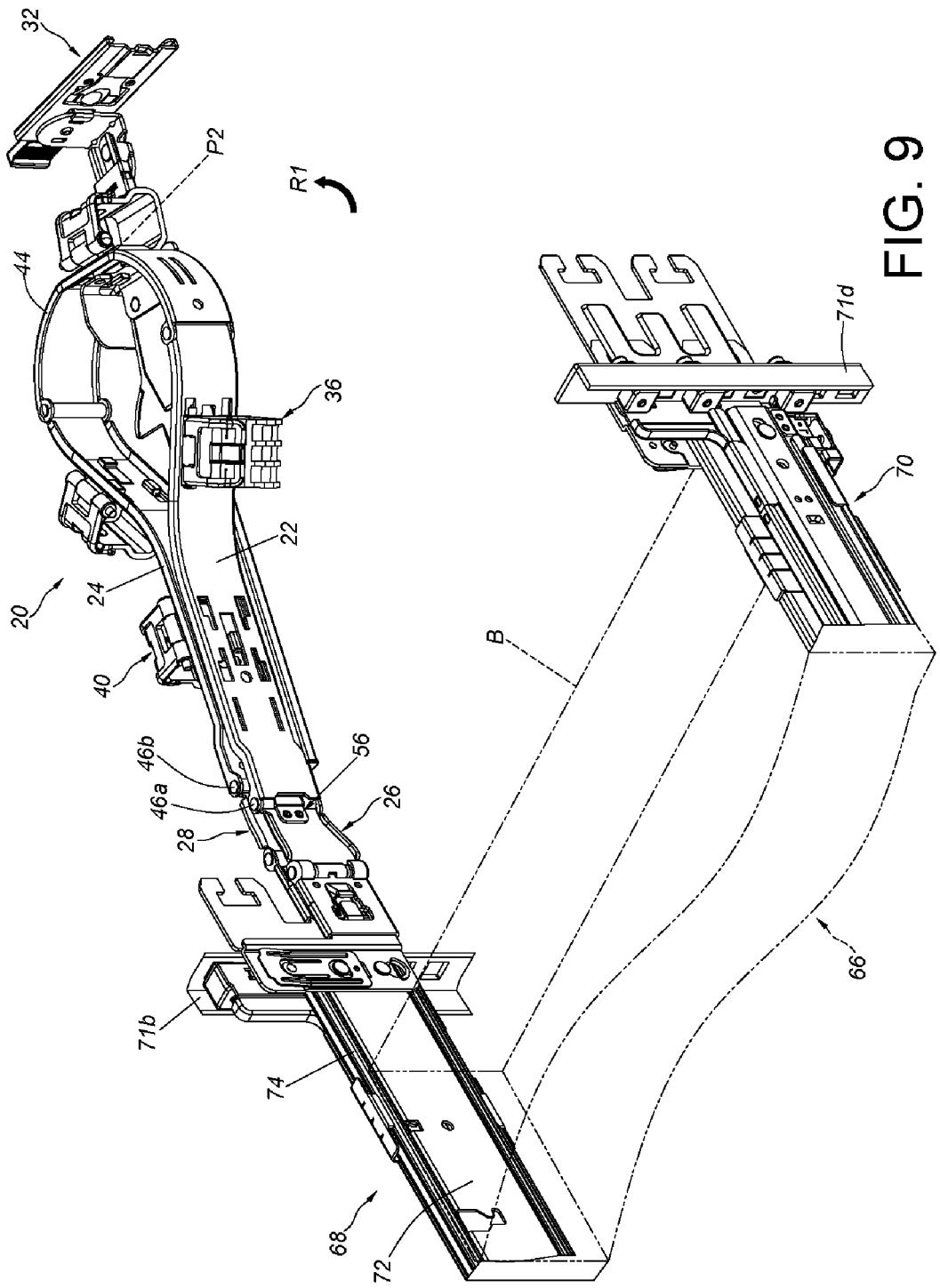
FIG. 9 is a three-dimensional diagram showing the cable management device of the connection mechanism according to the embodiment of the present invention applied to the rack, in which the first arm and the second arm are respectively at the second position relative to the first connection element and the second connection element.

As shown in FIG. 8 and FIG. 9, when the third connection element 32 is detached from the rear end of the fourth rail 78 of the second slide assembly 70, the first arm 22 and the second arm 24 can respectively pivot relative to the first connection element 26 and the second connection element 28 from the first position P1 (shown in FIG. 8) to the second position P2 (shown in FIG. 9) along the first rotation direction R1. The first arm 22 and the second arm 24 are capable of being kept at the second position P2 relative to the first connection element 26 and the second connection element 28 by cooperation between the engaging feature 54 and the corresponding feature 56 (shown in FIG. 6). With the arrangement, an open space can be maintained behind the rear portion B of the carried object 66, which is favorable for the user to maintain the electronic module located behind the rear portion B of the carried object 66.

To sum up, the connection mechanism and the cable management device 20 thereof according to the embodiment of the present invention includes the following feature.

The first arm 22 and the second arm 24 are capable of being kept at the second position P2 relative to the first connection element 26 and the second connection element 28 by cooperation (such as engagement) between the engaging feature 54 and the corresponding feature 56.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management device, comprising:
    a first arm having a first end portion and a second end portion, the first arm being arranged with at least one first cable management feature located between the first end portion and the second end portion of the first arm; and
    a first connection element pivotally connected to the second end portion of the first arm;
    wherein one of the first arm and the first connection element is arranged with an engaging feature, and the other one of the first arm and the first connection element is arranged with a corresponding feature;
    wherein the engaging feature has a connecting portion, a flexible portion, an engaging portion and a contacting portion, the flexible portion is connected to the connecting portion and bent relative to the connecting portion, the engaging portion is connected to the flexible portion and bent relative to the flexible portion, the contacting portion is connected to the engaging portion and bent relative to the engaging portion;
    wherein when the first arm pivots relative to the first connection element from a first position to a second position by a predetermined angle, the first arm is capable of being kept at the second position relative to the first connection element by cooperation between the engaging feature and the corresponding feature.

2. The cable management device of claim 1, wherein when the engaging feature is disengaged from the corresponding feature, the first arm is capable of returning to the first position from the second position relative to the first connection element.

3. The cable management device of claim 1, further comprising:
    a second arm having a first end portion and a second end portion, the first end portion of the second arm being pivotally connected to the first end portion of the first arm; and
    a second connection element pivotally connected to the second end portion of the second arm.

4. The cable management device of claim 3, wherein the second arm is arranged with at least one second cable management feature, and the at least one second cable management feature is located between the first end portion and the second end portion of the second arm.

5. The cable management device of claim 3, further comprising:
    at least one support member for supporting the first arm and the second arm.

6. The cable management device of claim 5, wherein the at least one support member is connected to a bottom of the first arm and a bottom of the second arm through a base.

7. The cable management device of claim 5, further comprising:
    a third connection element pivotally connected to the at least one support member, the first connection element, the second connection element and the third connection element being provided to respectively connect the cable management device to a first object, a second object and a third object.

8. The cable management device of claim 1, wherein the first connection element is pivotally connected to the second end portion of the first arm through a first shaft, the corresponding feature has a mounting portion and a corresponding portion, the corresponding portion is extended from the mounting portion and bent relative to the mounting portion, and the corresponding portion is passed around and protruded from the first shaft.

9. A cable management device, comprising:
    a first arm being arranged with at least one first cable management feature; and
    a first connection element pivotally connected to the first arm through a first shaft;

wherein one of the first arm and the first connection element is arranged with an engaging feature, and the other one of the first arm and the first connection element is arranged with a corresponding feature;

wherein the corresponding feature has a mounting portion and a corresponding portion, the corresponding portion is extended from the mounting portion and bent relative to the mounting portion, and the corresponding portion is passed around and protruded from the first shaft;

wherein when the first arm pivots relative to the first connection element to a position, the first arm is capable of being kept at the position relative to the first connection element by cooperation between the engaging feature and the corresponding feature.

10. The cable management device of claim 9, wherein when the engaging feature is disengaged from the corresponding feature, the first arm is capable of returning to an original position from the position relative to the first connection element.

11. The cable management device of claim 9, further comprising:
a second arm; and
a second connection element;
wherein each of the first arm and the second arm has a first end portion and a second end portion, the first end portion of the second arm is pivotally connected to the first end portion of the first arm, the first connection element is pivotally connected to the second end portion of the first arm, and the second connection element is pivotally connected to the second end portion of the second arm.

12. The cable management device of claim 11, wherein the first cable management feature is located between the first end portion and the second end portion of the first arm.

13. The cable management device of claim 9, wherein the engaging feature is an elastic member, and the elastic member has an engaging portion for engaging with the corresponding feature.

14. The cable management device of claim 11, further comprising:
at least one support member for supporting the first arm and the second arm.

15. The cable management device of claim 14, wherein the at least one support member is connected to a bottom of the first arm and a bottom of the second arm through a base.

16. The cable management device of claim 14, further comprising:
a third connection element pivotally connected to the at least one support member.

17. The cable management device of claim 9, wherein the engaging feature has a connecting portion, a flexible portion, an engaging portion and a contacting portion, the flexible portion is connected to the connecting portion and bent relative to the connecting portion, the engaging portion is connected to the flexible portion and bent relative to the flexible portion, the contacting portion is connected to the engaging portion and bent relative to the engaging portion.

18. A cable management device, comprising:
a first arm being arranged with at least one first cable management feature; and
a first connection element pivotally connected to the first arm;
wherein one of the first arm and the first connection element is arranged with an engaging feature, and the other one of the first arm and the first connection element is arranged with a corresponding feature;
wherein the engaging feature has a connecting portion, a flexible portion, an engaging portion and a contacting portion, the flexible portion is connected to the connecting portion and bent relative to the connecting portion, the engaging portion is connected to the flexible portion and bent relative to the flexible portion, the contacting portion is connected to the engaging portion and bent relative to the engaging portion;
wherein when the first arm pivots relative to the first connection element to a position, the first arm is capable of being kept at the position relative to the first connection element by cooperation between the engaging feature and the corresponding feature.

19. The cable management device of claim 18, wherein when the engaging feature is disengaged from the corresponding feature, the first arm is capable of returning to an original position from the position relative to the first connection element.

20. The cable management device of claim 18, further comprising:
a second arm; and
a second connection element;
wherein each of the first arm and the second arm has a first end portion and a second end portion, the first end portion of the second arm is pivotally connected to the first end portion of the first arm, the first connection element is pivotally connected to the second end portion of the first arm, and the second connection element is pivotally connected to the second end portion of the second arm.

* * * * *